US011047946B2

United States Patent
Dang et al.

(10) Patent No.: US 11,047,946 B2
(45) Date of Patent: Jun. 29, 2021

(54) DIFFERENTIAL CURRENT SENSING WITH ROBUST PATH, VOLTAGE OFFSET REMOVAL AND PROCESS, VOLTAGE, TEMPERATURE (PVT) TOLERANCE

(71) Applicant: QUALCOMM Incorporated, San Diego, CA (US)

(72) Inventors: Nam Dang, San Diego, CA (US); Rajeev Jain, San Diego, CA (US); Swarna Navubothu, San Diego, CA (US); Alan Lewis, Sunnyvale, CA (US); Martin Saint-Laurent, Austin, TX (US); Tung Nang Pham, Austin, TX (US); Joseph Terregrossa, Vista, CA (US); Paras Gupta, San Diego, CA (US); Somasekhar Maradani, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 386 days.

(21) Appl. No.: 15/974,271

(22) Filed: May 8, 2018

(65) Prior Publication Data

US 2019/0346528 A1 Nov. 14, 2019

(51) Int. Cl.
*G01R 35/00* (2006.01)
*G01R 19/25* (2006.01)
*H03K 5/003* (2006.01)

(52) U.S. Cl.
CPC .......... *G01R 35/005* (2013.01); *G01R 19/25* (2013.01); *H03K 5/003* (2013.01)

(58) Field of Classification Search
CPC ....... G01R 35/005; G01R 19/25; H03K 5/003
See application file for complete search history.

(56) References Cited

U.S. PATENT DOCUMENTS

| 6,032,109 | A  | * | 2/2000  | Ritmiller, III ........ G01D 3/022 |
|           |    |   |         | 702/104 |
| 6,552,579 | B1 |   | 4/2003  | Knoedgen |
| 7,994,766 | B2 |   | 8/2011  | De Lima Filho et al. |
| 9,369,043 | B2 |   | 6/2016  | Couleur et al. |
| 9,494,957 | B2 |   | 11/2016 | Price et al. |
| 2002/0163991 | A1 |   | 11/2002 | Stessman |

(Continued)

OTHER PUBLICATIONS

Laughton et al, Electrical Engineer's Reference Book, ISBN 978-0-7506-1202-9, 16th Edition, chapter 12 & chapter 13 (Year: 2003).*

"APSPA Arbitrary Pulsed Semiconductor Parameter Analyzer", APSPA User'S Manual, XX, XX, Jul. 3, 1998, XP002270247, figure 12, 89 pages.

(Continued)

*Primary Examiner* — Lisa E Peters
(74) *Attorney, Agent, or Firm* — Qualcomm Incorporated

(57) ABSTRACT

Aspects of the disclosure are directed to voltage-based current sensing. In accordance with one aspect, voltage-based current sensing may include performing a coarse calibration of a voltage based current sensor to determine a coarse offset; performing a fine calibration of the voltage based current sensor to determine a fine offset; performing a frequency calibration of the voltage based current sensor to determine a frequency offset; and performing a transfer function calibration of the voltage based current sensor to determine a sensor transfer function using one or more of the coarse offset, the fine offset and the frequency offset; and measuring a load current using the sensor transfer function.

8 Claims, 11 Drawing Sheets

(56) References Cited

U.S. PATENT DOCUMENTS

| | | |
|---|---|---|
| 2007/0188219 A1 | 8/2007 | Segarra |
| 2008/0143184 A1 | 6/2008 | Otsuga et al. |
| 2011/0227772 A1* | 9/2011 | Maurino .............. H03M 1/005 |
| | | 341/143 |
| 2012/0153917 A1* | 6/2012 | Adell ................. H02M 3/1588 |
| | | 323/283 |
| 2012/0283970 A1 | 11/2012 | Boehm |
| 2014/0191772 A1 | 7/2014 | Hetzler |
| 2016/0111958 A1 | 4/2016 | Choi et al. |
| 2016/0320446 A1 | 11/2016 | Huang |
| 2016/0380595 A1* | 12/2016 | Finlinson ............. H03G 1/0029 |
| | | 600/479 |
| 2018/0048324 A1* | 2/2018 | Samad ................ H03M 1/1014 |
| 2019/0212704 A1* | 7/2019 | Mahajan ............... G04F 10/005 |

OTHER PUBLICATIONS

International Search Report and Written Opinion—PCT/US2019/027777—ISA/EPO—dated Oct. 30, 2019 (176684WO).

Kayal M., et al., "Automatic Calibration of Hall Sensor Microsystems", Microelectronics Journal, Mackintosh Publications Ltd. Luton, GB, vol. 37, No. 12, Dec. 1, 2006, pp. 1569-1575, XP028078992, ISSN: 0026-2692, DOI: 10.1016/J.MEJO.2006.04.013 [retrieved on Dec. 1, 2006], figures 1, 2, 5, 6.

Tu C.C., et al., "A Low-Noise Area-Efficient Chopped VCO-Based CTDSM for Sensor Applications in 40-nm CMOS", IEEE Journal of Solid-State Circuits, IEEE Service Center, Piscataway, NJ, USA, vol. 52, No. 10, Oct. 1, 2017, XP011661122, ISSN: 0018-9200, DOI:10.1109/JSSC.2017.2724025 [retrieved on Sep. 21, 2017], figure 6, pp. 2523-2532.

* cited by examiner

DIFFERENTIAL CURRENT SENSING WITH ROBUST PATH, VOLTAGE OFFSET REMOVAL AND PROCESS, VOLTAGE, TEMPERATURE (PVT) TOLERANCE

TECHNICAL FIELD

This disclosure relates generally to the field of current sensing, and, in particular, to differential current sensing with robust path, voltage offset removal and process, voltage, temperature (PVT) tolerance.

BACKGROUND

Electrical current is an important parameter in microelectronics which often requires monitoring or sensing. One form of current sensing in microelectronic applications employs a mirror-based current sensor to monitor a particular current. When specific types of electronic switches are used to gate current to a central processing unit (CPU) or graphical processing unit (GPU) with a mirror-based current sensor, current sensing performance may be degraded due to inaccuracy in the mirrored currents. Electronic switches may be Globally Distributed Head Switches (GDHS) or Block Head Switches (BHS). Current sensing inaccuracy may be due to current mirror mismatches among various switch (GDHS or BHS) tiles due to the large occupied circuit area. Also, additional current sensing errors may be caused by variations in resistive losses among circuit traces to a sense amplifier and analog to digital converter (ADC) which handle the mirrored currents. Furthermore, the sense amplifier may be susceptible to very small voltage offsets in its input due to low drain to source voltages in transistors within the switch tiles.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides an apparatus and a method for voltage-based current sensing. Accordingly, a method for implementing voltage-based current sensing including performing a coarse calibration of a voltage based current sensor to determine a coarse offset; performing a fine calibration of the voltage based current sensor to determine a fine offset; and performing a transfer function calibration of the voltage based current sensor to determine a sensor transfer function using the coarse offset and the fine offset.

In one example, the method further includes measuring a load current by applying the sensor transfer function, and performing a frequency calibration of the voltage based current sensor to determine a frequency offset. In one example, the performing the transfer function calibration also uses the frequency offset to determine the sensor transfer function. In one example, the measuring the load current uses the sensor transfer function to map an analog to digital converter (ADC) code to the load current, wherein the ADC code is an output of the voltage based current sensor.

In one example, the performing the coarse calibration includes comparing a first frequency of a first oscillator waveform with a second frequency of a second oscillator waveform in a common mode, wherein the first oscillator waveform and the second oscillator waveform are outputs of the voltage based current sensor. In one example, the performing the fine calibration includes comparing a third frequency of a third oscillator waveform with a fourth frequency of a fourth oscillator waveform in a common mode, wherein the third oscillator waveform and the fourth oscillator waveform are outputs of the voltage based current sensor.

In one example, the first frequency is different from the third frequency, and the second frequency is different from the fourth frequency. In one example, the first oscillator waveform is different from the third oscillator waveform, and the second oscillator waveform is different from the fourth oscillator waveform. In one example, the performing the frequency calibration includes comparing a frequency of an oscillator waveform with a calibrated frequency reference and wherein the calibrated frequency reference has a lower frequency inaccuracy and a lower frequency instability than the frequency of the oscillator waveform, and wherein the oscillator waveform is an output of the voltage based current sensor.

Another aspect of the disclosure provides an apparatus for performing voltage-based current sensing, the apparatus including a voltage based current sensor, wherein the voltage based current sensor includes a first voltage input and a second voltage input, an input amplifier, a voltage-to-current converter coupled to the input amplifier, a first oscillator and a second oscillator, wherein the first oscillator and the second oscillator are coupled to the voltage-to-current converter, and a calibration module coupled to the voltage based current sensor, wherein the calibration module generates an analog to digital converter (ADC) code.

In one example, the input amplifier includes a plus output and a minus output, and wherein the plus output and the minus output are coupled to the voltage-to-current converter. In one example, the voltage-to-current converter includes a first current output and a second current output. In one example, a first current value of the first current output is proportional to a first voltage value of the plus output and a second current value of the second current output is proportional to a second voltage value of the minus output.

In one example, the first current output is coupled to the first oscillator and the second current output is coupled to the second oscillator. In one example, the first oscillator generates a first oscillator waveform and the second oscillator generates a second oscillator waveform. In one example, the first oscillator waveform has a first oscillator waveform frequency which is proportional to a first current measurement of the first current output, and the second oscillator waveform has a second oscillator waveform frequency which is proportional to a second current measurement of the second current output.

In one example, the first oscillator waveform has a first oscillator waveform frequency which is proportional to a first voltage measurement of the first voltage input, and the second oscillator waveform has a second oscillator waveform frequency which is proportional to a second voltage measurement of the second voltage input. In one example, the calibration module includes a first clock counter, a second clock counter and a subtractor, the subtractor coupled to the first clock counter and to the second clock counter. In one example, wherein the first oscillator waveform is inputted to the first clock counter and the second oscillator waveform is inputted to the second clock counter.

In one example, the first clock counter generates a first counter output, and the second clock counter generates a second counter output, and wherein the first counter output and the second counter output are inputted to the subtractor. In one example, the subtractor generates a subtractor output based on a difference between the first counter output and the second counter output. In one example, the calibration module generates a coarse offset and sends the coarse offset to the input amplifier. In one example, the calibration module generates a frequency offset and sends the frequency offset to the voltage-to-current converter. In one example, the first voltage input is connected to a first common mode transistor and a first sensing transistor, and the second voltage input is connected to a second common mode transistor and a second sensing transistor. In one example, the first common mode transistor and the first sensing transistor share a single first common node. In one example, the second common mode transistor and the second sensing transistor share a single second common node, and wherein the single second common node is different from the single first common node.

Another aspect of the disclosure provides an apparatus for performing voltage-based current sensing, the apparatus including means for performing a coarse calibration of a voltage based current sensor to determine a coarse offset; means for performing a fine calibration of the voltage based current sensor to determine a fine offset; and means for performing a transfer function calibration of the voltage based current sensor to determine a sensor transfer function using the coarse offset and the fine offset. In one example, the apparatus further includes means for performing a frequency calibration of the voltage based current sensor to determine a frequency offset; and means for measuring a load current by applying the sensor transfer function, wherein the sensor transfer function is determined using the frequency offset.

Another aspect of the disclosure provides a computer-readable medium storing computer executable code, operable on a device including at least one processor and at least one memory coupled to the at least one processor, wherein the at least one processor is configured to implement voltage-based current sensing, the computer executable code including instructions for causing a computer to perform a coarse calibration of a voltage based current sensor to determine a coarse offset; instructions for causing the computer to perform a fine calibration of the voltage based current sensor to determine a fine offset; instructions for causing the computer to perform a frequency calibration of the voltage based current sensor to determine a frequency offset; instructions for causing the computer to perform a transfer function calibration of the voltage based current sensor to determine a sensor transfer function using the coarse offset, the fine offset and the frequency offset; and instructions for causing the computer to measure a load current by applying the sensor transfer function.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
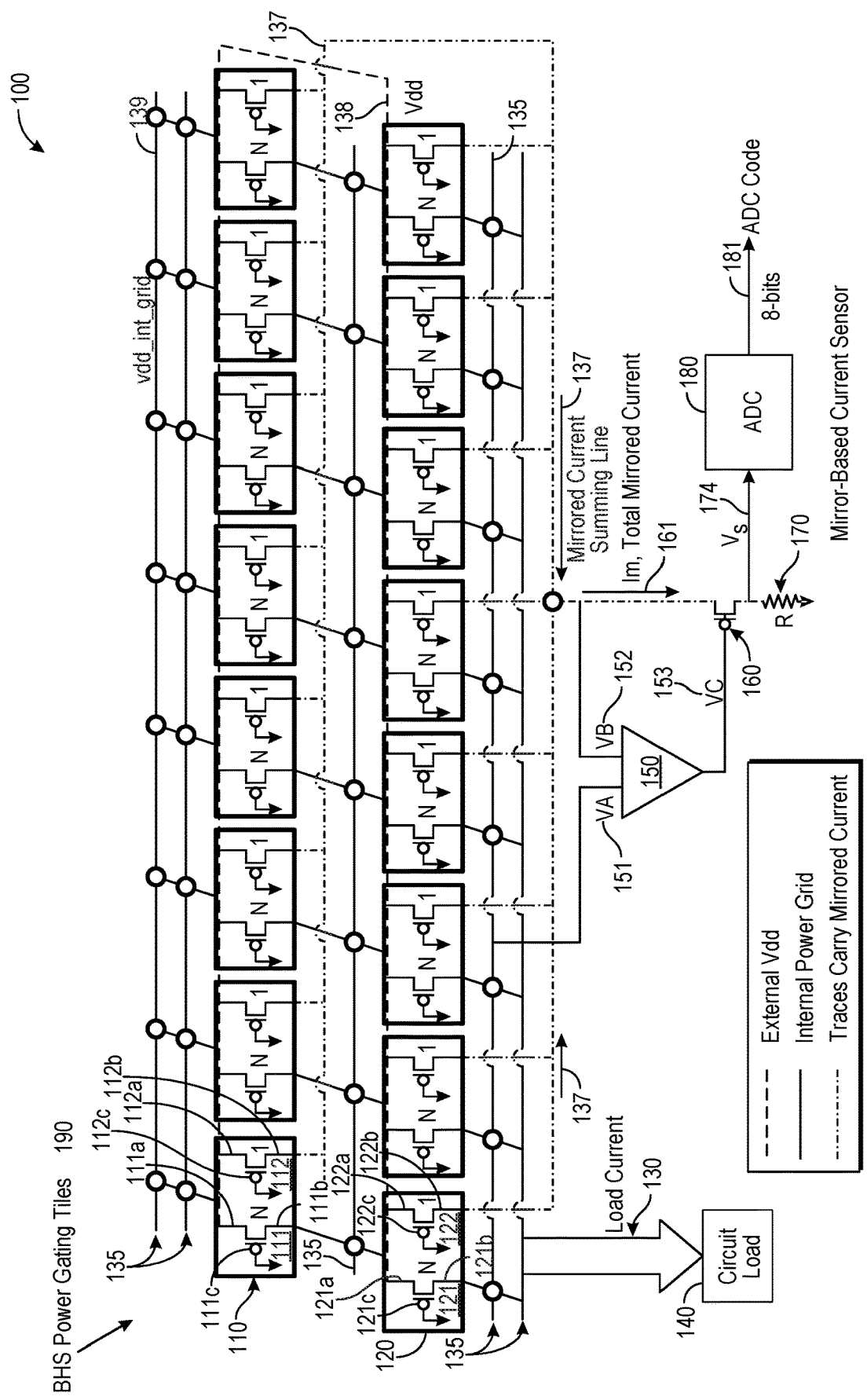
FIG. 1 illustrates an example mirror-based current sensor circuit.

FIG. 1 illustrates an example mirror-based current sensor circuit 100. In one example, a mirror-based current sensor is a current amplifier with a mirroring ratio (i.e., ratio of output current to input current) less than unity. As an example, FIG. 1 shows that for each pair of power transistor and mirror transistor, the mirroring ratio of the power transistor to the mirror transistor is labeled as N:1 where N is labeled with the power transistor and 1 is labeled with the mirror transistor.

The mirror-based current sensor circuit 100 includes a plurality of a Block Head Switches (BHS) power gating tiles 190 which are arranged into two tile rows, a top tile row 110 and a bottom tile row 120. Each BHS power gating tile 190 in the top tile row 110 includes a power transistor 111 on the left and a mirror transistor 112 on the right. In one example, the BHS power gating tile 190 has a current amplification ratio N. For example, the current amplification ratio is the ratio of the current through the power transistor 111 and the mirror transistor 112. In one example, the power transistor 111 is a field effect transistor (FET) with three terminals. For example, a first terminal (111*a*) may be a source terminal of the power transistor 111 and a second terminal (111*b*) may be a drain terminal of the power transistor 111. For example, a third terminal (111*c*) may be a gate terminal of the power transistor 111 which may be tied to ground. In one example, the mirror transistor 112 is a field effect transistor (FET) with three terminals. For example, a first terminal (112*a*) may be a source terminal of the mirror transistor 112 and a second terminal (112*b*) may be a drain terminal of the mirror transistor 112. For example, a third terminal (112*c*) may be a gate terminal of the mirror transistor 112 which may be tied to ground.

Each BHS power gating tile 190 in the bottom tile row 120 includes a power transistor 121 on the left and a mirror transistor 122 on the right. In one example, the BHS power gating tile 190 has a current amplification ratio N. For example, the current amplification ratio is the ratio of the current through the power transistor 121 and the mirror transistor 122. In one example, the power transistor 121 is a field effect transistor (FET) with three terminals. For example, a first terminal (121*a*) may be a source terminal of the power transistor 121 and a second terminal (121*b*) may be a drain terminal of the power transistor 121. For example, a third terminal (121*c*) may be a gate terminal of the power transistor 121 which may be tied to ground. In one example, the mirror transistor 122 is a field effect transistor (FET) with three terminals. For example, a first terminal (122*a*) may be a source terminal of the mirror transistor 122 and a second terminal (122*b*) may be a drain terminal of the mirror transistor 122. For example, a third terminal (122*c*) may be a gate terminal of the mirror transistor 122 which may be tied to ground.

In one example, the second terminal (e.g., drain terminal) of the power transistors 121 of the bottom tile row 120 may be collectively tied together to produce a load current 130 for a circuit load 140. In one example, the circuit load 140 is a central processing unit (CPU) or a graphics processing unit (GPU). In one example, the first terminal of transistors 111, 112, 121, 122 may be tied to a source voltage vdd 138.

In one example, a first amplifier input voltage VA 151 is tied to the powered current summing line 135 and a second amplifier input voltage VB 152 is tied to the mirrored current summing line 137. In one example, the first amplifier input voltage VA 151 and the second amplifier input voltage VB 152 are differentially amplified by differential amplifier 150. In one example, an amplifier output voltage VC 153 is proportional to a difference between the first amplifier input voltage VA 151 and the second amplifier input voltage VB 152. In one example, the amplifier output voltage VC 153 is connected to a gate terminal of a sense transistor 160. In one example, a total mirrored current 161 from the mirrored current summing line 137 is inputted to a source terminal of the sense transistor 160 and is outputted from a drain terminal of the sense transistor 160. In one example, the powered current summing line 135 is an integral grid voltage vdd_int_grid 139. In one example, the powered current summing line 135 (as indicated in FIG. 1) is a grid made of multiple horizontal and vertical interconnected lines (e.g., a power distribution network).

In one example, the total mirrored current 161 from the sense transistor 160 is sent to sense resistor (labeled as R) 170 where a sense voltage Vs 174, proportional to the total mirrored current 161, is developed. In one example, the sense voltage Vs 174 is an analog input to an analog to digital converter (ADC) 180. In one example, the ADC 180 produces a digital output ADC code 181 with N bits of resolution. In one example, N=8.

Figure 2:
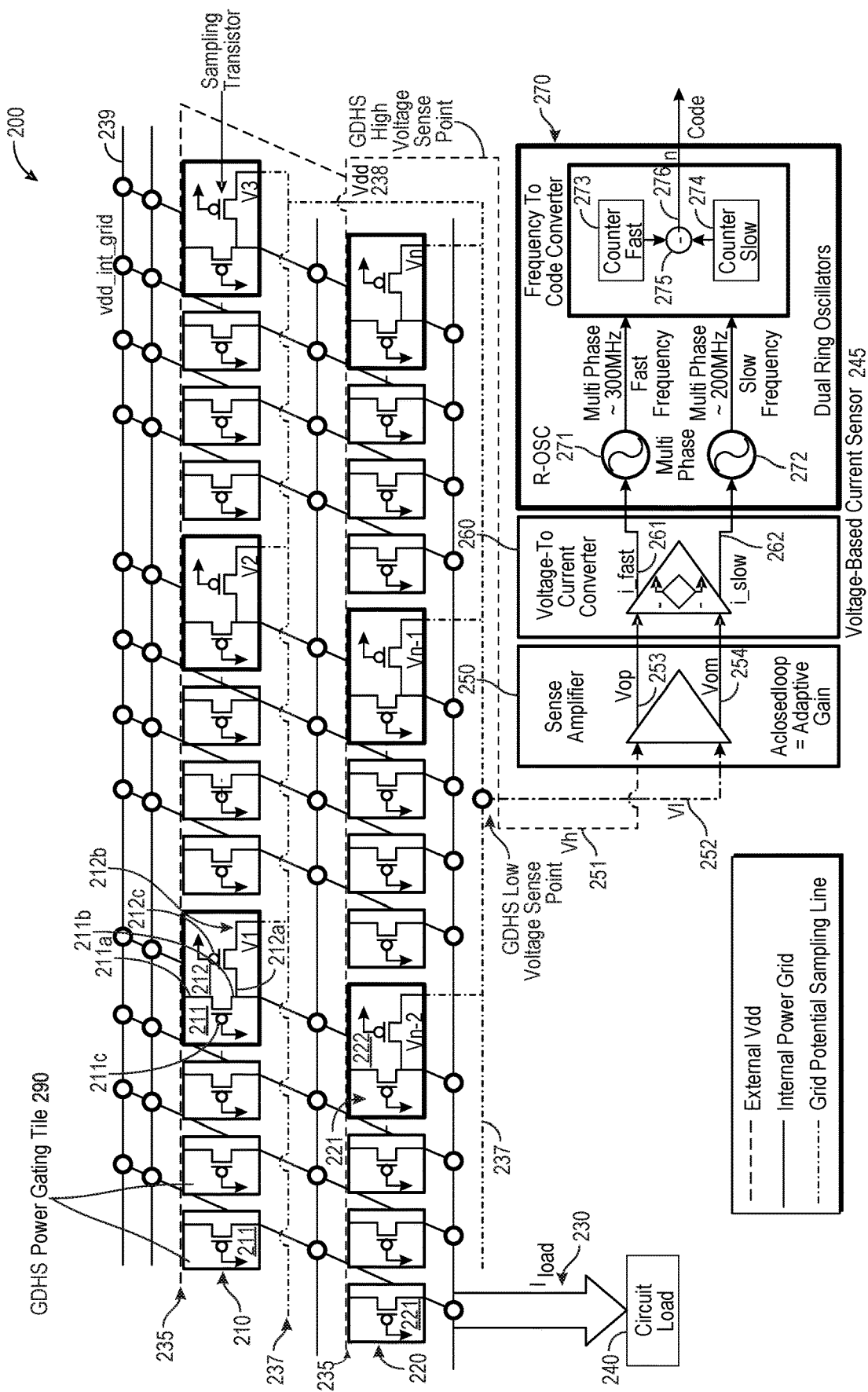
FIG. 2 illustrates an example voltage-based current sensor circuit.

FIG. 2 illustrates an example voltage-based current sensor circuit 200. The voltage-based current sensor circuit 200 includes a plurality of Globally Distributed Head Switches (GDHS) power gating tiles 290 which are arranged into two tile rows, a top tile row 210 and a bottom tile row 220. Each GDHS power gating tile 290 in the top tile row 210 includes a power transistor 211 on the left and may or may not include a sampling transistor 212 on the right. In one example, the power transistor 211 is a field effect transistor (FET) with three terminals.

For example, a first terminal (211*a*) may be a source terminal of the power transistor 211 and a second terminal (211*b*) may be a drain terminal of the power transistor 211. For example, a third terminal (211*c*) may be a gate terminal of the power transistor 211 which may be tied to ground. In one example, the sampling transistor 212 is a field effect transistor (FET) with three terminals. For example, a first terminal (212*a*) may be a source terminal of the sampling transistor 212 and a second terminal (212*b*) may be a drain terminal of the sampling transistor 212. For example, a third terminal (212*c*) may be a gate terminal of the sampling transistor 212 which may be tied to ground. In one example, the sampling transistor 212 is used to sample a voltage associated with the power transistor 211.

Each GDHS power gating tile 290 in the bottom tile row 220 includes a power transistor 221 on the left and may or may not include a sampling transistor 222 on the right. In one example, the power transistor 221 is a field effect transistor (FET) with three terminals. For example, a first terminal (221*a*) may be a source terminal of the power transistor 221 and a second terminal (221*b*) may be a drain terminal of the power transistor 221. For example, a third terminal (221*c*) may be a gate terminal of the power transistor 221 which may be tied to ground. In one example, the sampling transistor 222 is a field effect transistor (FET) with three terminals. For example, a first terminal (222*a*) may be a source terminal of the sampling transistor 222 and a second terminal (222*b*) may be a drain terminal of the sampling transistor 222. For example, a third terminal (222*c*) may be a gate terminal of the sampling transistor 222 which may be tied to ground. In one example, the sampling transistor 222 is used to sample a voltage associated with the power transistor 221. In FIG. 2, the voltages associated with each of the sampling transistors are labeled as v1, v2, v3, vn-2 . . . vn-1 and vn.

In one example, the second terminal (e.g., drain terminal) of the power transistors 221 of the bottom tile row 220 may be collectively tied together to produce a load current $I_{load}$ 230 for a circuit load 240. In one example, the circuit load 240 is a central processing unit (CPU) or a graphics processing unit (GPU). In one example, the first terminal of transistors 211, 212, 221, 222 may be tied to a source voltage vdd 238.

In one example, the voltage-based current sensor circuit 200 includes a voltage-based current sensor 245. As shown in the example of FIG. 2, the voltage-based current sensor 245 includes a sense amplifier 250, a voltage to current converter 260 and a frequency to code converter 270. Example components of the sense amplifier 250, the voltage to current converter 260 and the frequency to code converter 270 are disclosed herein. However, one skilled in the art would understand that, within the scope and spirit of the present disclosure, the example components disclosed herein are not exclusive and that other components may be included or that some of the example components may not be used to achieve one or more of the functions of the sense amplifier, the voltage to current converter and/or the frequency to code converter.

In one example, a first sense amplifier input voltage Vh 251 is tied to an external voltage grid 235 and a second sense amplifier input voltage Vl 252 is tied to a sampled current summing line 237. In one example, the first sense amplifier input voltage Vh 251 and the second sense amplifier input voltage Vl 252 are amplified by sense amplifier 250. In one example, a first sense amplifier output voltage Vop 253 and a second sense amplifier output voltage Vom 254 are proportional to the first sense amplifier input voltage Vh 251 and the second sense amplifier input voltage Vl 252. In one example, the first sense amplifier output voltage Vop 253 and the second sense amplifier output voltage Vom 254 are connected to a voltage to current converter 260. In one example, a powered current summing line 239 is an integral grid voltage vdd_int_grid 239. In one example, the powered current summing line 239 is a grid made of multiple horizontal and vertical interconnected lines (e.g., a power distribution network).

In one example, the first sense amplifier output voltage Vop 253 and the second sense amplifier output voltage Vom 254 generate a first voltage to current converter output current i_fast 261 and a second voltage to current converter output current i_slow 262. Next, the first voltage to current converter output current i_fast 261 may drive a first oscillator (e.g., first ring oscillator) 271 and the second voltage to current converter output current i_slow 262 may drive a second oscillator (e.g., second ring oscillator) 272. As shown in FIG. 2, the first oscillator 271 and the second oscillator are part of the frequency to code converter 270. In one example, a frequency of the first oscillator 271 is proportional to the first sense amplifier input voltage Vh 251 and a frequency of the second oscillator 272 is proportional to the second sense amplifier input voltage Vl 252.

In one example, the frequency of the first oscillator 271 may be measured by a first counter 273 and the frequency of the second oscillator 272 may be measured by a second counter 274. In one example, a difference frequency value 276 is generated by a subtractor 275 using the output of the first counter 273 as a first input to the subtractor 275 and the output of the second counter 274 as a second input to the subtractor 275. In one example, the difference frequency value 276 is a digital output of the voltage-based current sensor 245 with n bits, where n is a positive integer.

Figure 3:
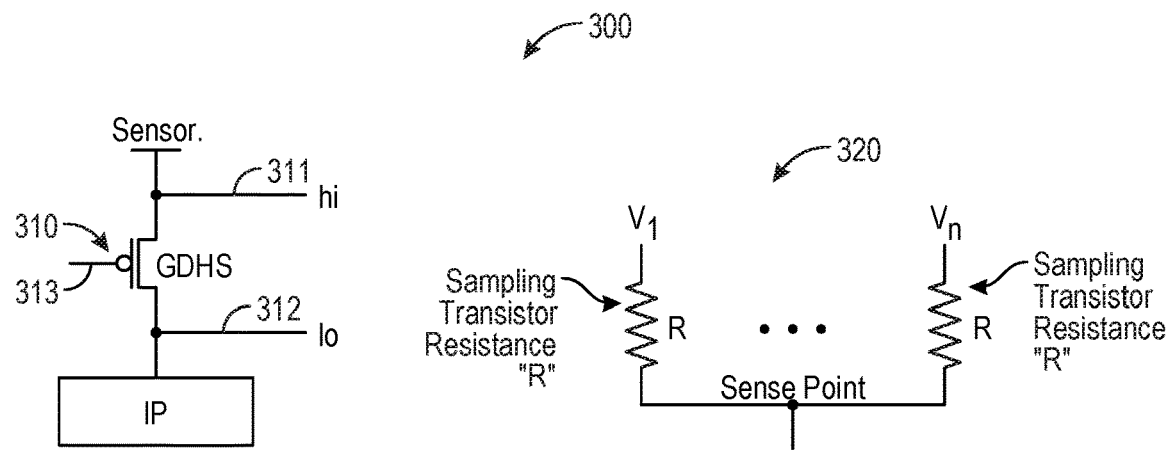
FIG. 3 illustrates an example voltage sensor using a sampling transistor.

In one example, voltage sensing may be achieved using a sampling transistor. FIG. 3 illustrates an example voltage sensor 300 using a sampling transistor 310. In the example shown in FIG. 3, the sampling transistor 310 is a Globally Distributed Head Switches (GDHS). However, one skilled in the art would understand that other types of transistors are also within the scope and spirit of the present disclosure. In one example, the sampling transistor 310 is a field effect transistor (FET) with three terminals. For example, a first terminal 311 may be a source terminal of the sampling transistor 310 and a second terminal 312 may be a drain terminal of the sampling transistor 310. For example, a third terminal 313 may be a gate terminal of the sampling transistor 310 which may be tied to ground.

In one example, current sensing may be achieved by measuring a plurality of voltage differences. For example, each voltage difference may be a voltage difference across two terminals of each sampling transistor 310, e.g., across first terminal 311 and second terminal 312. In one example, each voltage difference depends on a resistance of each sampling transistor 310 and load current $I_{load}$ 230 (shown in FIG. 2). Each voltage difference may be between a high side voltage $V_{HI}$ at the first terminal 311 (which may be referenced to a common package plane) and a low side voltage $V_{LO}$ at the second terminal 312. In one example, the common package plane has negligible resistance. The low side voltage $V_{LO}$ of each sampling transistor 310 may be connected to a common low side power mesh. In one example, the example voltage sensor 300 uses transistors to implement the resistor network shown in the right side 320 of FIG. 3 with area savings and about ±30% variation with PVT (Process-Voltage-Temperature).

In one example, each GDHS power gating tile 290 (shown in FIG. 2) may be uniformly distributed across the voltage-based current sensor circuit 200 (shown in FIG. 2). In one example, the voltage sensing across any one current sensor circuit may not accurately represent the total current drawn by the load current $I_{load}$ 230 for circuit load 240 due to local logic activity differences. In one example, sampling transistors may be placed in N locations with all sampling transistors connected together at the common low side power mesh. For example, the common low side power mesh may have a common low side voltage which is approximately an average of all low side voltages $V_{LO}$ for the sampling transistors. The quantity N may be determined by the required accuracy of current sensing. For example, the quantity N may determine a standard deviation of a current sensing error, e.g., the standard deviation may be inversely proportional to the square root of N. In one example, each sampling transistor may offer a high impedance to each GDHS power gating tile 290 and does not impact GDHS power gating tile functionality or circuit load functionality.

Figure 4:
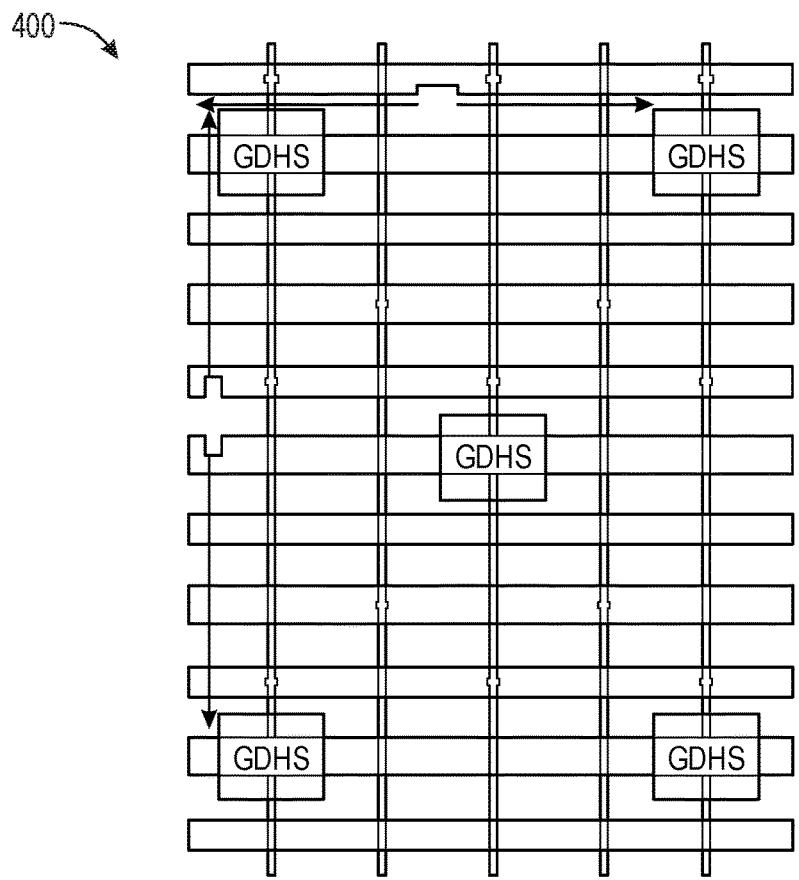
FIG. 4 illustrates an example Globally Distributed Head Switches (GDHS) power gating tile architecture.

In one example, a GDHS power gating tile architecture has switches distributed uniformly over a circuit area. In one example, voltages across each GDHS power gating tile for a given circuit load could differ due to variances in local logic activity. FIG. 4 illustrates an example Globally Distributed Head Switches (GDHS) power gating tile architecture 400. For example, each GDHS power gating tile is a power switch which is distributed in a regular pattern over logic gates. In addition, an on-die power grid may supply an external voltage VDD_EXT and distribute an internal voltage VDD_INT. In one example, the external voltage VDD_EXT may provide an always on power domain for certain logic functions.

Figure 5:
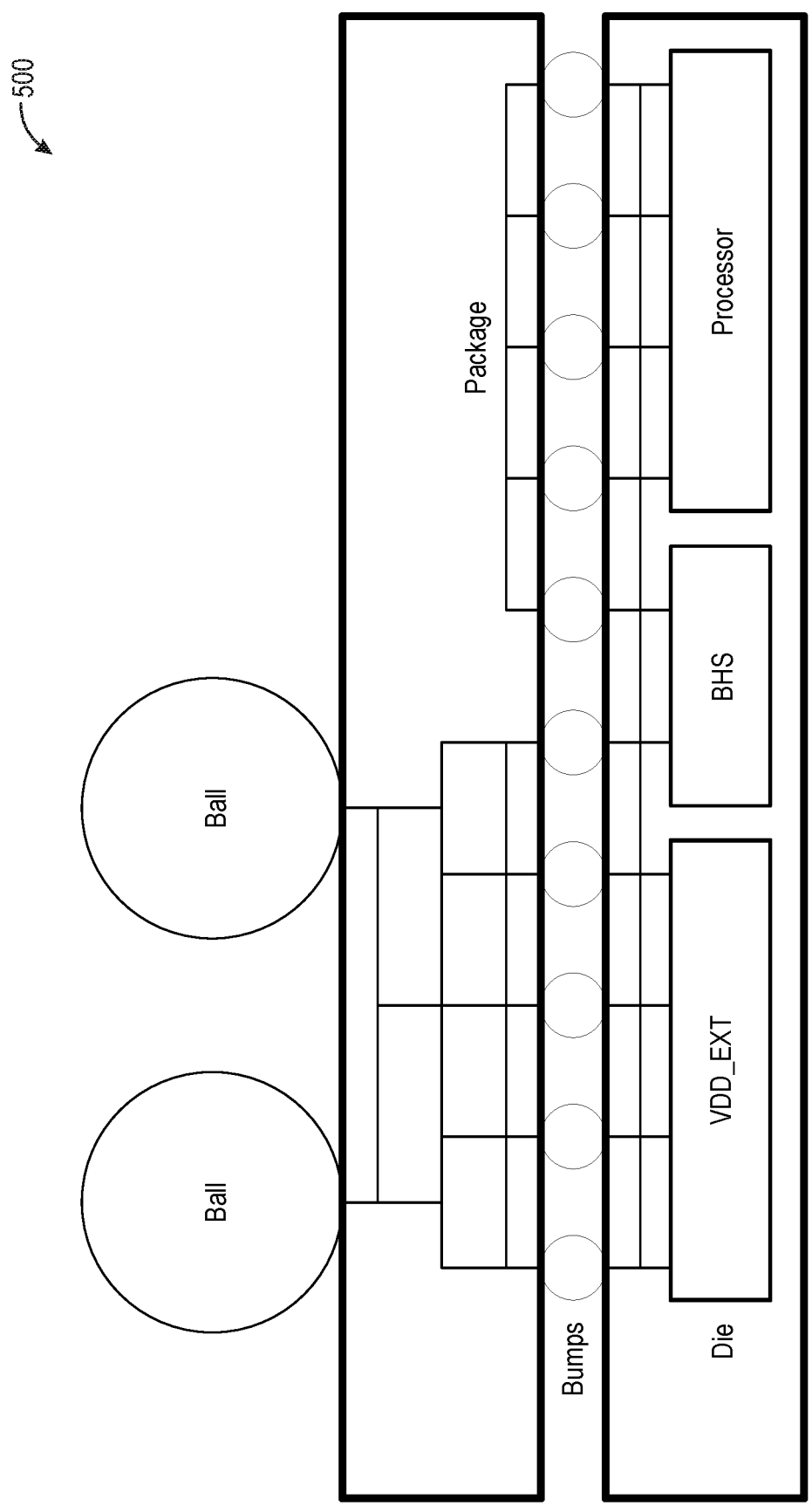
FIG. 5 illustrates an example Block Head Switches (BHS) power gating tile architecture.

In one example, a BHS power gating tile architecture has switches aggregated in one location as a set of tiles. In one example, voltages across each BHS power gating tile for a given circuit load may provide an accurate representation of load current since the BHS power gating tiles may be concentrated in one location. FIG. 5 illustrates an example Block Head Switches (BHS) power gating tile architecture 500. For example, each BHS power gating tile is a power switch which uses the package layers to distribute internal voltage VDD_INT. In one example, the BHS power gating tile architecture provides on-die power distribution and allows current sharing by power switches.

In one example, a voltage based current sensor may operate in several modes to ensure accurate current sensing. For example, a coarse calibration mode may be used to determine a coarse offset. For example, the coarse offset may be a sensor offset in an analog section of the voltage based current sensor. For example, a fine calibration mode may be used to determine a fine offset. For example, the fine offset may be a sensor offset in a digital section of the voltage based current sensor. A frequency calibration mode, for example, may be used to determine a frequency offset. A transfer function calibration mode, for example, may be used to determine a sensor transfer function (e.g., load current to ADC code transfer function). For example, a current measuring mode may be used to measure a load current in terms of ADC code.

Figure 6:
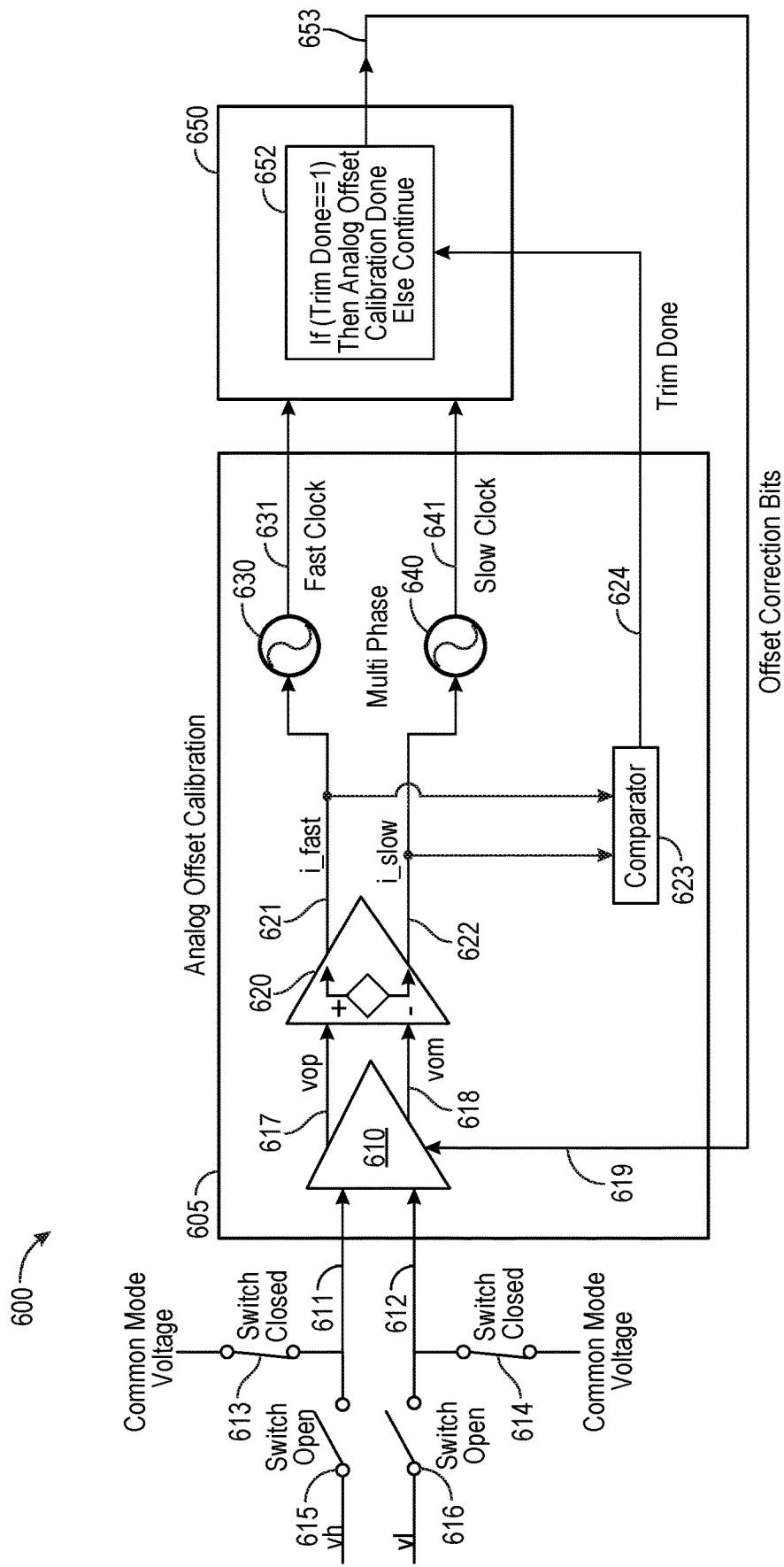
FIG. 6 illustrates an example architecture for performing a coarse calibration.

FIG. 6 illustrates an example architecture 600 for performing a coarse calibration. In one example, the architecture 600 includes a voltage based current sensor 605. The voltage based current sensor 605 may include a first input 611 and a second input 612 which are sent to an input amplifier 610 with two amplifier outputs, a plus output Vop 617 and a minus output Vom 618. In one example, the first input 611 is a voltage input (a.k.a., a first voltage input) and the second input 612 is a voltage input (a.k.a., a second voltage input). In one example, the first input 611 is connected to a first common mode switch 613 and a first sensing switch 615. In one example, the second input 612 is connected to a second common mode switch 614 and a second sensing switch 616. In addition, the input amplifier 610 may include a coarse offset 619 for coarse calibration.

During coarse calibration mode, the voltage based current sensor may be placed into a common mode by closing the first common mode switch 613 and the second common mode switch 614 and by opening the first sensing switch 615 and the second sensing switch 616. In one example, the common mode has the first input 611 and the second input 612 set to a common input. Next, in one example, the plus output Vop 617 and the minus output Vom 618 serve as two inputs to a voltage-to-current converter 620 with two current outputs, a first current output 621 and a second current output 622. In one example, the first current output 621 (e.g., i_fast) is proportional to the plus output Vop 617 and the second current output 622 (e.g., i_slow) is proportional to the minus output Vom 618.

In one example, the first current output 621 serves as an input to a first oscillator 630 and the second current output 622 serves as an input to a second oscillator 640. In one example, the first oscillator 630 produces a first oscillator waveform 631 (e.g., Fast_clock) and the second oscillator 640 produces a second oscillator waveform 641 (e.g., Slow_clock). In one example, the first oscillator waveform 631 has a first frequency and the second oscillator waveform 641 has a second frequency. In one example, the first frequency depends on the first current output 621, for example, the first frequency may be proportional to the first current output 621. In one example, the second frequency depends on the second current output 622, for example, the second frequency may be proportional to the second current output 622.

For example, a frequency comparison of the first frequency of the first oscillator waveform 631 with the second frequency of the second oscillator waveform 641 may be used to compare the first current output 621 to the second current output 622. Moreover, the frequency comparison of the first frequency of the first oscillator waveform 631 with the second frequency of the second oscillator waveform 641 may be used to compare the plus output Vop 617 with the minus output Vom 618. That is, a comparison of the first oscillator waveform 631 and the second oscillator waveform 641 (e.g., the first frequency compared to the second frequency) yields a proportional comparison of the two amplifier outputs (e.g., plus output Vop 617 and minus output Vom 618). For example, the frequency comparison determines a coarse offset of the voltage based current sensor. For example, the frequency comparison determines a sign and magnitude of the coarse offset of the voltage based current sensor.

In one example, an output difference voltage $V_{diff}$ (not shown) may be defined as a difference between the plus output Vop 617 and the minus output Vom 618. That is, $V_{diff}$=Vop−Vom. In one example, when a common input is applied to the first input 611 and the second input 612 of the input amplifier 610, the output difference voltage $V_{diff}$ is nonzero if the coarse calibration has not been performed. In another example, when the common input is applied to the first input 611 and the second input 612 of the input amplifier 610, the output difference voltage $V_{diff}$ is zero if the coarse calibration has been performed. In one example, the coarse offset drives the output difference voltage $V_{diff}$ to zero after coarse calibration has been performed.

In one example, the first oscillator waveform 631 and the second oscillator waveform 641 serve as two inputs to a calibration module 650. In one example, the calibration module 650 produces an offset calibration output 653 which serves as the coarse offset 619 to input amplifier 610. For example, the offset calibration output 653 is dependent on the frequency comparison of the first frequency of the first oscillator waveform 631 and the second frequency of the second oscillator waveform 641 (e.g., the first frequency compared to the second frequency). For example, the offset calibration output 653 drives the coarse offset of the input amplifier 610 towards zero. In one example, the offset calibration output 653 is stored and applied to an analog to digital converter (ADC) as the coarse offset during a current measuring mode. That is, the coarse offset is applied during the current measuring mode.

In one example, the first current output 621 and the second current output 622 serve as two inputs to a comparator 623. In one example, the comparator 623 produces a comparator output signal 624 (e.g., Trim_Done). For example, the comparator output signal 624 indicates a relative difference between the first current output 621 and second current output 622. For example, the comparator output signal 624 may have a discrete number of states. For example, the discrete number of states may be two, where the two states either indicate that the first current output 621 equals the second current output 622, within a predefined tolerance, or that the first current output 621 does not equal the second current output 622, outside the predefined tolerance.

In one example, the discrete number of states may be three, where the three states indicate (a) if the first current output 621 is greater than the second current output 622, (b) if the first current output 621 is less than the second current output 622, or (c) if the first current output 621 is equal to the second current output 622, all within a predefined tolerance. In one example, the comparator output signal 624 serves as an input to a calibration termination module 652 which uses the comparator output signal 624 to determine if a coarse calibration is complete or not. For example, the discrete number of states may be used to determine if a coarse calibration is complete or not. In one example, the offset calibration output 653 (e.g., offset correction bits) is updated if the coarse calibration is not complete and is not updated if the coarse calibration is complete.

Figure 7:
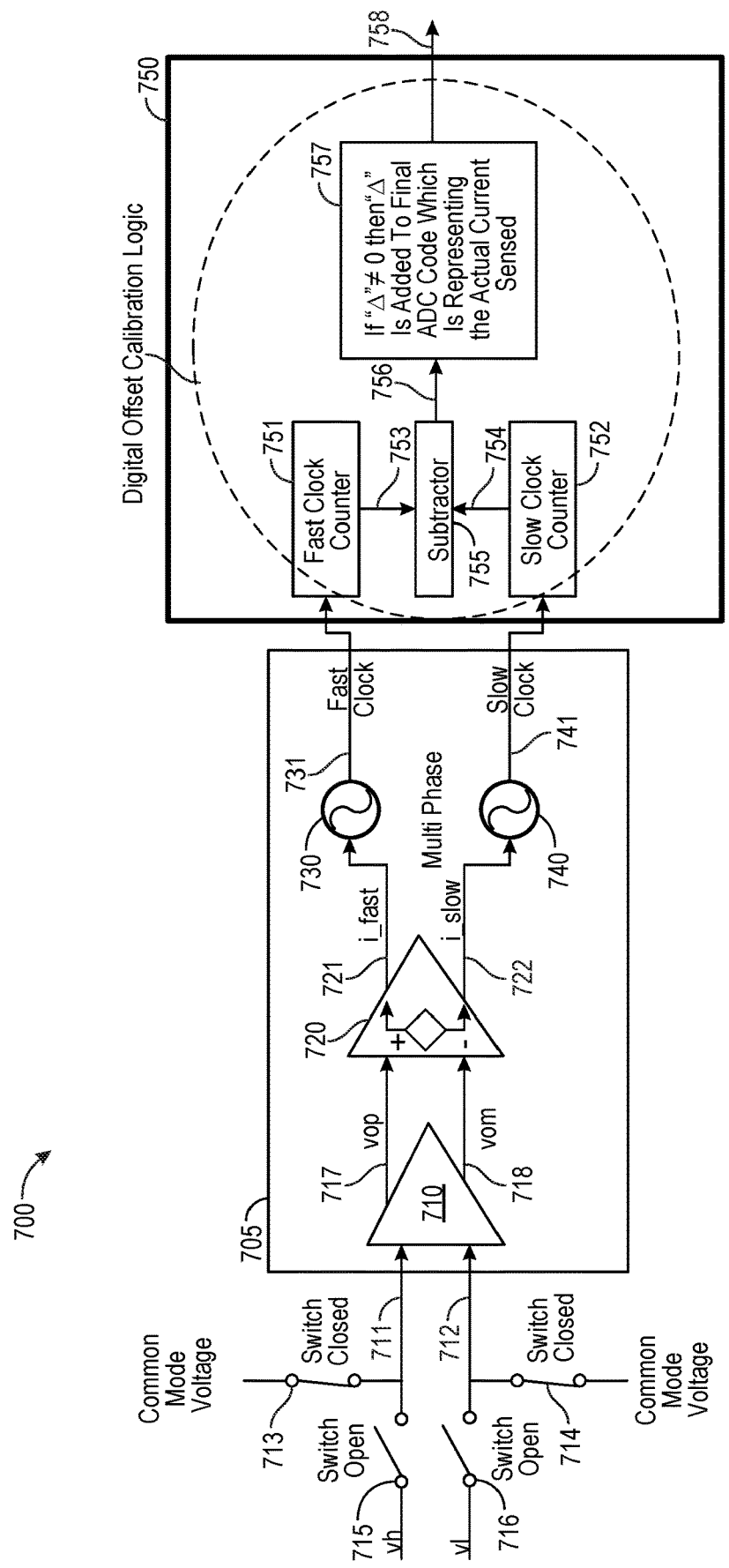
FIG. 7 illustrates an example architecture for performing a fine calibration.

FIG. 7 illustrates an example architecture 700 for performing a fine calibration. In one example, the architecture 700 includes a voltage based current sensor 705. The voltage based current sensor 705 may include a first input 711 and a second input 712 which are sent to an input amplifier 710 with two amplifier outputs, a plus output Vop 717 and a minus output Vom 718. In one example, the first input 711 is a voltage input (a.k.a., a first voltage input) and the second input 712 is a voltage input (a.k.a., a second voltage input). In one example, the first input 711 is connected to a first common mode switch 713 and a first sensing switch 715. In one example, the second input 712 is connected to a second common mode switch 714 and a second sensing switch 716.

During fine calibration mode, the voltage based current sensor may be placed into a common mode by closing the first common mode switch 713 and the second common mode switch 714 and by opening the first sensing switch 715 and the second sensing switch 716. In one example, the common mode has the first input 711 and the second input 712 set to a common input. Next, in one example, the plus output Vop 717 and the minus output Vom 718 serve as two inputs to a voltage-to-current converter 720 with two current outputs, a first current output 721 and a second current output 722. In one example, the first current output 721 (e.g., i_fast) is proportional to the plus output Vop 717 and the second current output 722 (e.g., i_slow) is proportional to the minus output Vom 718.

In one example, the first current output 721 serves as an input to a first oscillator 730 and the second current output 722 serves as an input to a second oscillator 740. In one example, the first oscillator 730 produces a first oscillator waveform 731 (e.g., Fast_clock) and the second oscillator 740 produces a second oscillator waveform 741 (e.g., Slow_clock). In one example, the first oscillator waveform 731 has a first frequency and the second oscillator waveform 741 has a second frequency. In one example, the first frequency depends on the first current output 721, for example, the first frequency may be proportional to the first current output 721. In one example, the second frequency depends on the second current output 722, for example, the second frequency may be proportional to the second current output 722.

For example, a frequency comparison of the first frequency of the first oscillator waveform 731 with the second frequency of the second oscillator waveform 741 may be used to compare the first current output 721 to the second current output 722. Moreover, the frequency comparison of the first frequency of the first oscillator waveform 731 with the second frequency of the second oscillator waveform 741 may be used to compare the plus output Vop 717 with the minus output Vom 718. That is, a comparison of the first oscillator waveform 731 and the second oscillator waveform 741 (e.g., the first frequency compared to the second frequency) yields a proportional comparison of the two amplifier outputs (e.g., plus output Vop 717 and minus output Vom 718). For example, the frequency comparison determines a fine offset of the voltage based current sensor. For example, the frequency comparison determines a sign and magnitude of the fine offset of the voltage based current sensor.

In one example, the first oscillator waveform 731 and the second oscillator waveform 741 serve as two inputs to a calibration module 750. In one example, the first oscillator waveform 731 is an input to a first clock counter 751 (e.g., fast clock counter) and the second oscillator waveform 741 is an input to a second clock counter 752 (e.g., slow clock counter). In one example, the first clock counter 751 provides a first counter output 753 and the second clock counter 752 provides a second counter output 754. For example, the first counter output 753 is proportional to the first frequency and the second counter output 754 is proportional to the second frequency. That is, the first counter output 753 may measure the first frequency and the second counter output 754 may measure the second frequency.

In one example, the first counter output 753 and the second counter output 754 serve as inputs to subtractor 755. For example, the subtractor 755 provides a subtractor output 756. In one example, the subtractor output 756 is the difference between the first counter output 753 and the second counter output 754. That is, the subtractor output 756 may measure a frequency difference between the first frequency and the second frequency.

In one example, the subtractor output 756 is an input to a digital calibration module 757. In one example, the digital calibration module 757 provides a calibration output 758 (e.g., a fine offset). In one example, the calibration output 758 (e.g., a fine offset) is stored and applied to an analog to digital converter (ADC) as a fine correction input for correcting the fine offset during a current measuring mode. In one example, the calibration output 758 (e.g., a fine offset) is applied during the current measuring mode.

Figure 8:
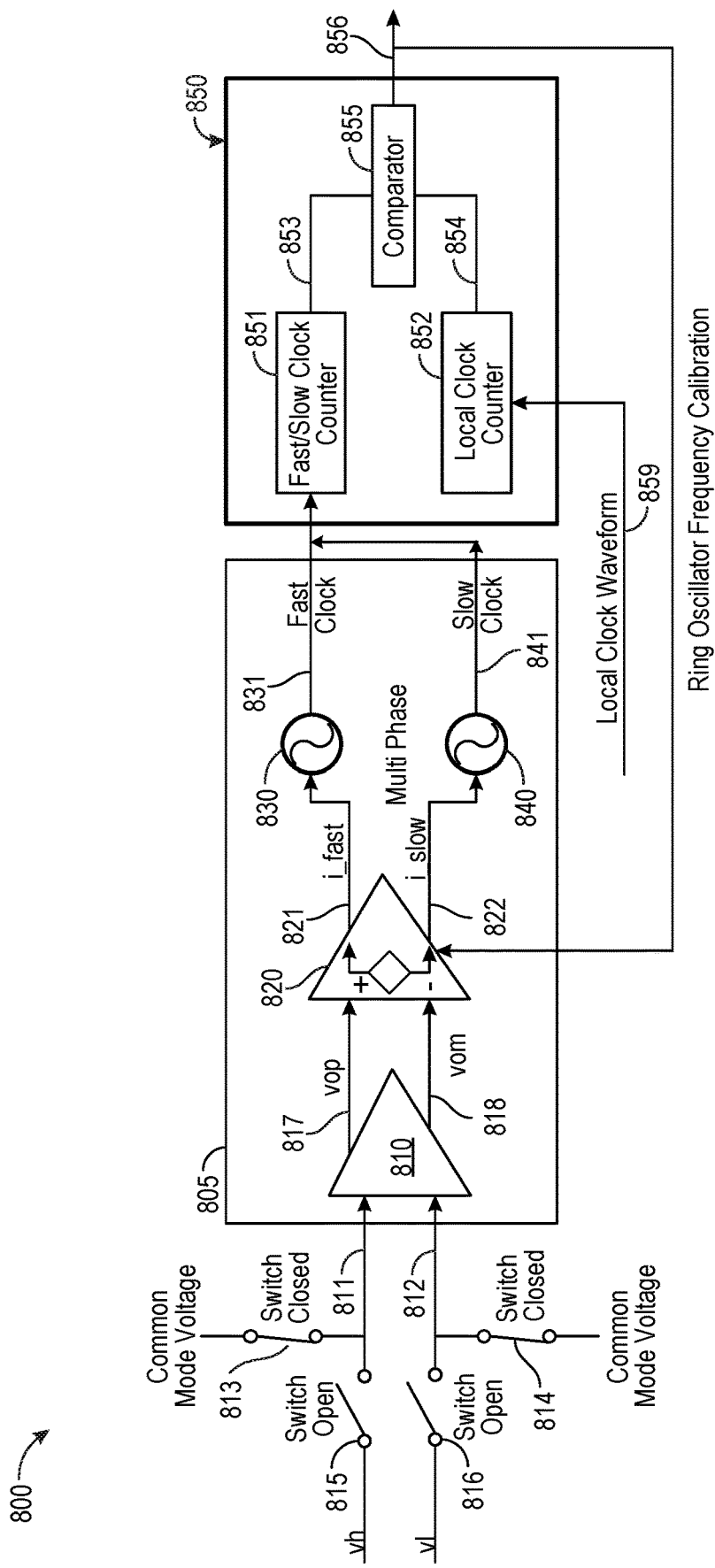
FIG. 8 illustrates an example architecture for calibrating an oscillator frequency calibration.

FIG. 8 illustrates an example architecture 800 for calibrating an oscillator frequency. In one example, the architecture 800 includes a voltage based current sensor 805. The voltage based current sensor 805 may include a first input 811 and a second input 812 which are sent to an input amplifier 810 with two amplifier outputs, a plus output Vop 817 and a minus output Vom 818. In one example, the first input 811 is connected to a first common mode switch 813 and a first sensing switch 815. In one example, the second input 812 is connected to a second common mode switch 814 and a second sensing switch 816. In one example, the first input 811 is a voltage input (a.k.a., a first voltage input) and the second input 812 is a voltage input (a.k.a., a second voltage input).

During oscillator frequency calibration mode, the voltage based current sensor 805 may be placed into a common mode by closing the first common mode switch 813 and the second common mode switch 814 and by opening the first sensing switch 815 and the second sensing switch 816. Next, in one example, the plus output Vop 817 and the minus output Vom 818 serve as two inputs to a voltage-to-current converter 820 with two current outputs, a first current output 821 and a second current output 822. In one example, the first current output 821 (e.g., i_fast) is proportional to the plus output Vop 817 and the second current output 822 (e.g., i_slow) is proportional to the minus output Vom 818.

In one example, the first current output 821 serves as an input to a first oscillator 830 and the second current output 822 serves as an input to a second oscillator 840. In one example, the first oscillator 830 produces a first oscillator waveform 831 (e.g., Fast_clock) and the second oscillator 840 produces a second oscillator waveform 841 (e.g., Slow_clock). In one example, the first oscillator waveform 831 has a first frequency and the second oscillator waveform 841 has a second frequency. In one example, the first frequency depends on the first current output 821, for example, the first frequency may be proportional to the first current output 821. In one example, the second frequency depends on the second current output 822, for example, the second frequency may be proportional to the second current output 822.

For example, a comparison of the first frequency of the first oscillator waveform 831 with the second frequency of the second oscillator waveform 841 may be used to compare the first current output 821 to the second current output 822. Moreover, the comparison of the first frequency of the first oscillator waveform 831 with the second frequency of the second oscillator waveform 841 may be used to compare the plus output Vop 817 with the minus output Vom 818. That is, a comparison of the first oscillator waveform 831 and the second oscillator waveform 841 (e.g., the first frequency compared to the second frequency) yields a proportional comparison of the two amplifier outputs (e.g., plus output Vop 817 and minus output Vom 818).

In one example, the first oscillator waveform 831 and the second oscillator waveform 841 serve as inputs to a calibration module 850. In one example, the first oscillator waveform 831 is a first input to a first clock counter 851 (e.g., fast/slow clock counter) and the second oscillator waveform 841 is a second input to the first clock counter 851 (e.g., fast/slow clock counter). In one example, a local clock waveform 859 with a local clock frequency is another input to calibration module 850. In one example, the local clock waveform 859 is an input to a second clock counter 852 (e.g., local clock counter). For example, the local clock waveform 859 may be a calibrated frequency reference with smaller frequency inaccuracy and smaller frequency instability than the first oscillator waveform 831 and the second oscillator waveform 832. For example, frequency inaccuracy is a mean absolute difference between an oscillator waveform frequency and a calibrated reference frequency. For example, frequency instability is a statistical measure of an oscillator waveform frequency variation over time or environmental conditions.

In one example, the first clock counter 851 provides a first counter output 853 and the second clock counter 852 provides a second counter output 854. For example, the first counter output 853 is proportional to the first frequency of the first oscillator waveform 831 or to the second frequency of the second oscillator waveform 841. That is, the first counter output 853 may measure the first frequency if the first oscillator waveform 831 is the input to the first clock counter 851 (e.g., fast/slow clock counter) or may measure the second frequency if the second oscillator waveform 841 is the input to the first clock counter 851 (e.g., fast/slow clock counter). For example, the second counter output 854 is proportional to the local clock frequency of the local clock waveform 859. That is, the second counter output 854 may measure local clock frequency.

In one example, the first counter output 853 and the second counter output 854 serve as inputs to comparator 855. For example, the comparator 855 provides a comparator output 856. In one example, the comparator output 856 is the difference between the first counter output 853 and the second counter output 854. That is, the comparator output 856 may measure a frequency difference between the first frequency or the second frequency and the local clock frequency. For example, the local clock frequency may serve as a calibrated frequency reference for the measurement of either the first frequency or the second frequency.

In one example, the comparator output 856 is an input to the voltage-to-current converter 820. In one example, the input to the voltage-to-current converter 820 is a frequency offset to regulate the first current output 821 or to regulate the second current output 822. For example, the frequency offset (i.e., the comparator output 856 used as an input to the voltage-to-current converter 820) may be used to steer the first frequency or the second frequency to the local clock frequency. In one example, the frequency offset may correct process, voltage, and temperature (PVT) impacts on the first frequency or the second frequency. That is, the frequency offset is applied during the current measuring mode.

Figure 9:
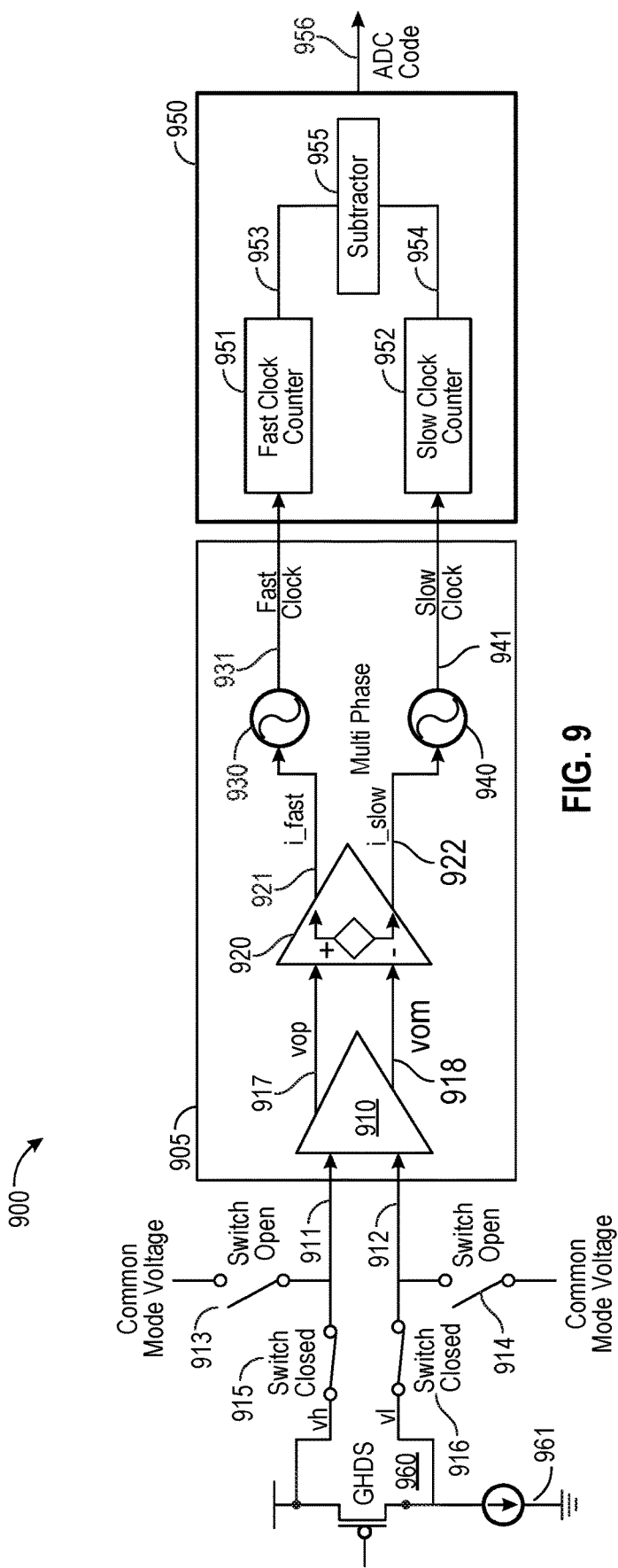
FIG. 9 illustrates an example architecture for calibrating a sensor transfer function.

FIG. 9 illustrates an example architecture 900 for calibrating a sensor transfer function. In one example, the architecture 900 includes a voltage based current sensor 905. The voltage based current sensor 905 may include a first input 911 and a second input 912 which are sent to an input amplifier 910 with two amplifier outputs, a plus output Vop 917 and a minus output Vom 918. In one example, the first input 911 is a voltage input (a.k.a., a first voltage input) and the second input 912 is a voltage input (a.k.a., a second voltage input). In one example, the first input 911 is connected to a first common mode switch 913 and a first sensing switch 915. In one example, the second input 912 is connected to a second common mode switch 914 and a second sensing switch 916.

During sensor transfer function calibration, the voltage based current sensor 905 may be placed into a sensing mode by opening the first common mode switch 913 and the second common mode switch 914 and by closing the first sensing switch 915 and the second sensing switch 916. Next, in one example, the plus output Vop 917 and the minus output Vom 918 serve as two inputs to a voltage-to-current converter 920 with two current outputs, a first current output 921 and a second current output 922. In one example, the first current output 921 (e.g., i_fast) is proportional to the plus output Vop 917 and the second current output 922 (e.g., i_slow) is proportional to the minus output Vom 918.

In one example, the first current output 921 serves as an input to a first oscillator 930 and the second current output 922 serves as an input to a second oscillator 940. In one example, the first oscillator 930 produces a first oscillator waveform 931 (e.g., Fast_clock) and the second oscillator 940 produces a second oscillator waveform 941 (e.g. Slow_clock). In one example, the first oscillator waveform 931 has a first frequency and the second oscillator waveform 941 has a second frequency. In one example, the first frequency depends on the first current output 921, for example, the first frequency may be proportional to the first current output 921. In one example, the second frequency depends on the second current output 922, for example, the second frequency may be proportional to the second current output 922.

In one example, the first oscillator waveform 931 and the second oscillator waveform 941 serve as two inputs to a calibration module 950. In one example, the first oscillator waveform 931 is an input to a first clock counter 951 (e.g., fast clock counter) and the second oscillator waveform 941 is an input to a second clock counter 952 (e.g., slow clock counter). In one example, the first clock counter 951 provides a first counter output 953 and the second clock counter 952 provides a second counter output 954. For example, the first counter output 953 is proportional to the first frequency and the second counter output 954 is proportional to the second frequency. That is, the first counter output 953 may measure the first frequency and the second counter output 954 may measure the second frequency.

In one example, the first counter output 953 and the second counter output 954 serve as inputs to subtractor 955. For example, the subtractor 955 provides a subtractor output 956. In one example, the subtractor output 956 is the difference between the first counter output 953 and the second counter output 954. That is, the subtractor output 956 may measure a frequency difference between the first frequency and the second frequency.

In one example, the subtractor output 956 may by an ADC code (e.g., ADC digital output). For example, the sensor transfer function calibration may be performed by using a calibrated reference input. In one example, the calibrated reference input may be generated by using a reference voltage based current sensor (e.g., a Globally Distributed Head Switches (GDHS) 960) coupled to a load current 961. In one example, the transfer function calibration mode may be used to determine a mapping from the load current 961 and the ADC code 956 after determining the coarse offset and the fine offset.

For example, the load current 961 may be set to a first current value and a first ADC code value may be recorded. Next, the load current 961 may be set to a second current value and a second ADC code value may be recorded. For example, the load current 961 may be set to multiple current values and multiple ADC code values may be recorded. In one example, the multiple current values and multiple ADC code values may be used to generate a sensor transfer function from load current to ADC code (e.g., ADC code vs. load current). For example, the sensor transfer function is a mapping from load current to ADC code (e.g., ADC code vs. load current). That is, the sensor transfer function is applied during the current measuring mode.

Figure 10:
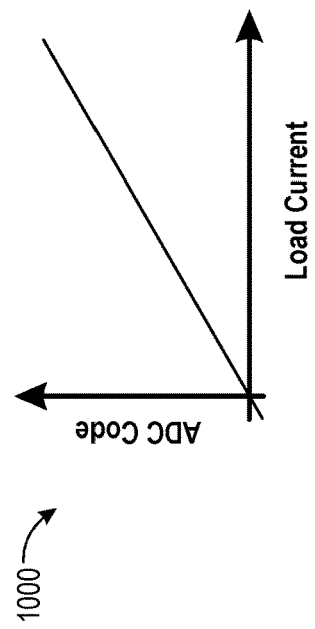
FIG. 10 illustrates an example graph of a sensor transfer function which is a linear curve fit.

In one example, the sensor transfer function may be a linear curve fit of the multiple current values and the multiple ADC code values. FIG. 10 illustrates an example graph 1000 of a sensor transfer function which is a linear curve fit. The example graph 1000 has a horizontal axis marked as load current and a vertical axis marked as ADC code. For example, the linear curve fit may have a slope parameter and intercept parameter for a linear sensor calibration equation. In one example, the linear sensor calibration equation may be used to map the ADC code 956 to the load current 961. For example, the linear sensor calibration equation may be stored as software, firmware or hardware.

In another example, the sensor transfer function may be a nonlinear curve fit of the multiple current values and the multiple ADC code values. For example, the nonlinear curve fit may use a nonlinear equation (e.g., quadratic, cubic, logarithmic, exponential, etc.) for a nonlinear sensor calibration equation. In one example, the nonlinear sensor calibration equation may be used to map the ADC code 956 to the load current 961. For example, the nonlinear sensor calibration equation may be stored as software, firmware or hardware.

In one example, a voltage based current sensor converts load current to ADC code. For example, phase shifted free running parallel counters may be used to measure frequencies of an oscillator waveforms. For example, counter data from the parallel counters may be periodically captured in a common system domain which allows simple signal processing. In one example, counter data in a binary code format may be converted to a Gray code format to minimize instantaneous data loss as the frequency changes. In one example, a de-metastable (DEMET) circuit may be used to capture counter data in a common system domain to maintain synchronicity among the parallel counters. In one example, the counter data in Gray code format may be converted back to binary code format after data capture. For example, the parallel counters may utilize overflow arithmetic to eliminate complex sample control logic. In one example, a difference count between two parallel counters (e.g., a fast counter and a slow counter) may be used to measure the frequencies of the oscillator waveforms. One skilled in the art would understand that the examples disclosed herein are not limiting and that other implementations may be used within the scope and spirit of the present disclosure.

Figure 11:
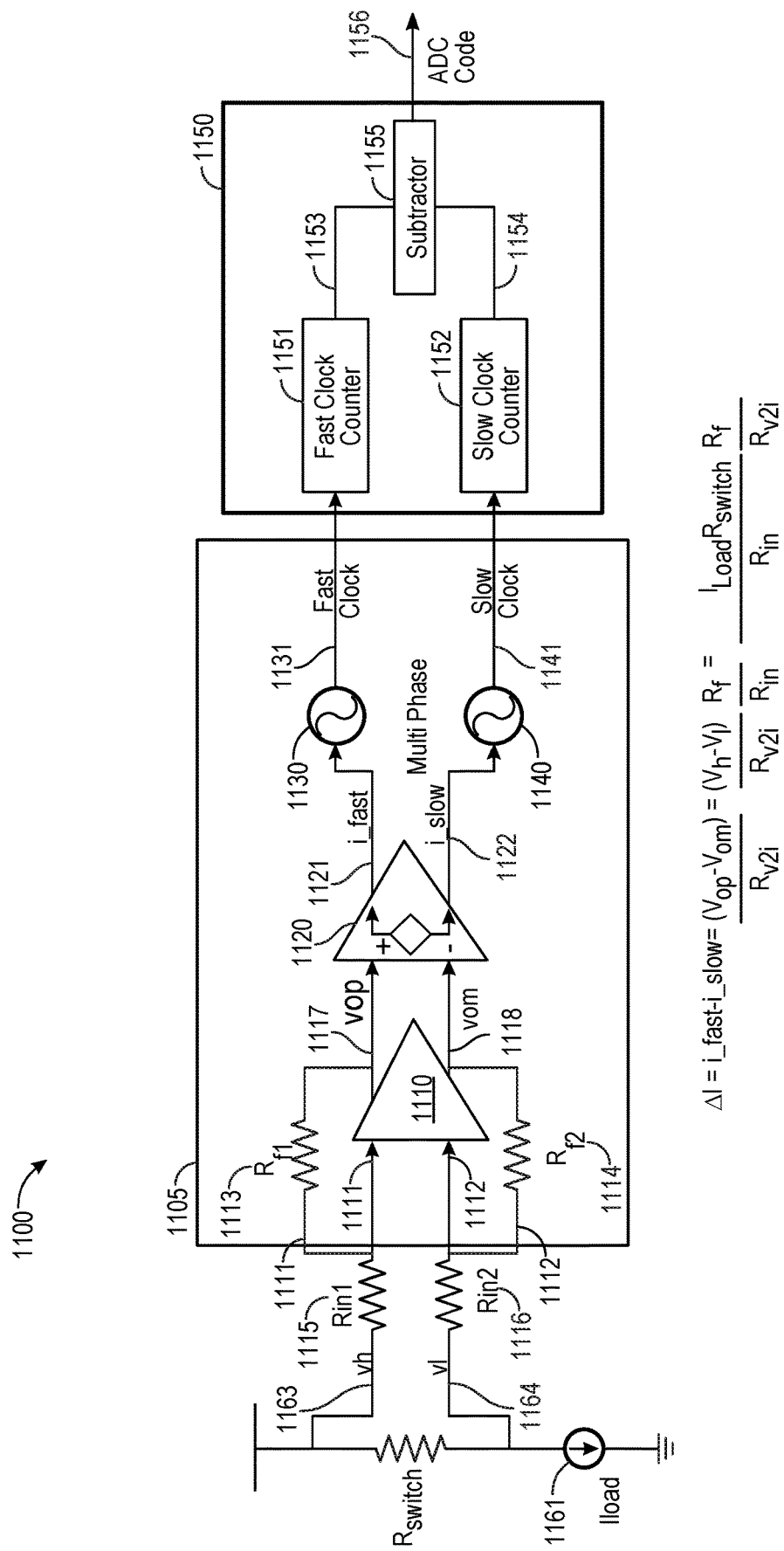
FIG. 11 illustrates an example switch variation adaptive tracking circuit.

FIG. 11 illustrates an example switch variation adaptive tracking circuit 1100. As shown in FIG. 11, the example switch variation adaptive tracking circuit 1100 includes a voltage based current sensor 1105. The voltage based current sensor may include a first input 1111 and a second input 1112 which are sent to an input amplifier 1110 with two amplifier outputs, a plus output Vop 1117 and a minus output Vom 1118. In one example, the first input 1111 is a voltage input (a.k.a., a first voltage input) and the second input 1112 is a voltage input (a.k.a., a second voltage input).

In one example, the first input 1111 is connected to a first feedback resistor $R_{f1}$ 1113 and a first input resistor $R_{in1}$ 1115. In one example, the second input 1112 is connected to a second feedback resistor $R_{f2}$ 1114 and a second input resistor $R_{in2}$ 1116. In one example, the plus output Vop 1117 is connected to the first feedback resistor $R_{f1}$ 1113. In one example, the minus output Vom 1118 is connected to the second feedback resistor $R_{f2}$ 1114.

In one example, the plus output Vop 1117 and the minus output Vom 1118 serve as two inputs to a voltage-to-current converter 1120 with two current outputs, a first current output 1121 and a second current output 1122. In one example, the first current output 1121 (e.g., i_fast) is proportional to the plus output Vop 1117 and the second current output 1122 (e.g., i_slow) is proportional to the minus output Vom 1118. In one example, the voltage-to-current converter 1120 includes a converter input resistor $R_{v2i}$ (not shown).

In one example, the first current output 1121 serves as an input to a first oscillator 1130 and the second current output 1122 serves as an input to a second oscillator 1140. In one example, the first oscillator 1130 produces a first oscillator waveform 1131 (e.g., Fast_clock) and the second oscillator 1140 produces a second oscillator waveform 1141 (e.g., Slow_clock). In one example, the first oscillator waveform 1131 has a first frequency and the second oscillator waveform 1141 has a second frequency. In one example, the first frequency depends on the first current output 1121, for example, the first frequency may be proportional to the first current output 1121. In one example, the second frequency depends on the second current output 1122, for example, the second frequency may be proportional to the second current output 1122.

In one example, the first oscillator waveform 1131 and the second oscillator waveform 1141 serve as two inputs to a calibration module 1150. In one example, the first oscillator waveform 1131 is an input to a first clock counter 1151 (e.g., fast clock counter) and the second oscillator waveform 1141 is an input to a second clock counter 1152 (e.g., slow clock counter). In one example, the first clock counter 1151 provides (i.e., generates) a first counter output 1153 and second clock counter 1152 provides (i.e., generates) a second counter output 1154. For example, the first counter output 1153 is proportional to the first frequency and the second counter output 1154 is proportional to the second frequency. That is, the first counter output 1153 may measure the first frequency and the second counter output 1154 may measure the second frequency.

In one example, the first counter output 1153 and the second counter output 1154 serve as inputs to subtractor 1155. The subtractor 1155 provides a subtractor output 1156. In one example, the subtractor output 1156 is the difference between the first counter output 1153 and the second counter output 1154. That is, the subtractor output 1156 may measure a frequency difference between the first frequency and the second frequency.

In one example, the subtractor output 1156 may by an ADC code (e.g., ADC digital output). For example, the switch variation adaptive tracking circuit 1100 may perform the tracking using a calibrated reference input. In one example, the calibrated reference input may be generated by using a reference switch resistor $R_{switch}$ 1160 coupled to a load current $I_{load}$ 1161. The reference switch resistor $R_{switch}$ 1160 may have a first voltage vh 1163 at a first terminal 1163 and a second voltage vl 1164 at a second terminal 1164. In one example, the first terminal 1163 is connected to the first input resistor $R_{in1}$ 1115 and the second terminal 1164 is connected to the second input resistor $R_{in2}$ 1116.

In one example, a differential current ΔI (not shown), equal to the difference between the first current output 1121 (e.g., i_fast) and the second current output 1122 (e.g., i_slow), is related to other parameters by the following equation:

$$\Delta I = i\_fast - i\_slow$$
$$= (Vop - Vom)/R_{v2i} = [(vh - vl)/R_{v2i}](R_f/R_{in})$$
$$= [(I_{load}R_{switch})/R_{in}](R_f/R_{v2i})$$

In one example, $R_{in1} = R_{in2} = R_{in}$ and $R_{f1} = R_{f2} = R_f$.

In one example, the first input resistor $R_{in1}$ and the second input $R_{in2}$ are both equal to a common input resistor $R_{in}$. In one example, the first feedback resistor $R_{f1}$ and the second feedback resistor $R_{f2}$ are both equal to a common feedback resistor $R_f$. In one example, the common input resistor $R_{in}$ is the same type as reference switch resistor $R_{switch}$ such that PVT variations may be tracked together. In one example, the feedback resistor $R_f$ is the same type as converter input resistor $R_{v2i}$ such that their PVT variations may be tracked together. In one example the differential current ΔI is dependent only on load current $I_{load}$ 1161. Thus, differential current ΔI is a direct measure of load current $I_{load}$ 1161.

Figure 12:
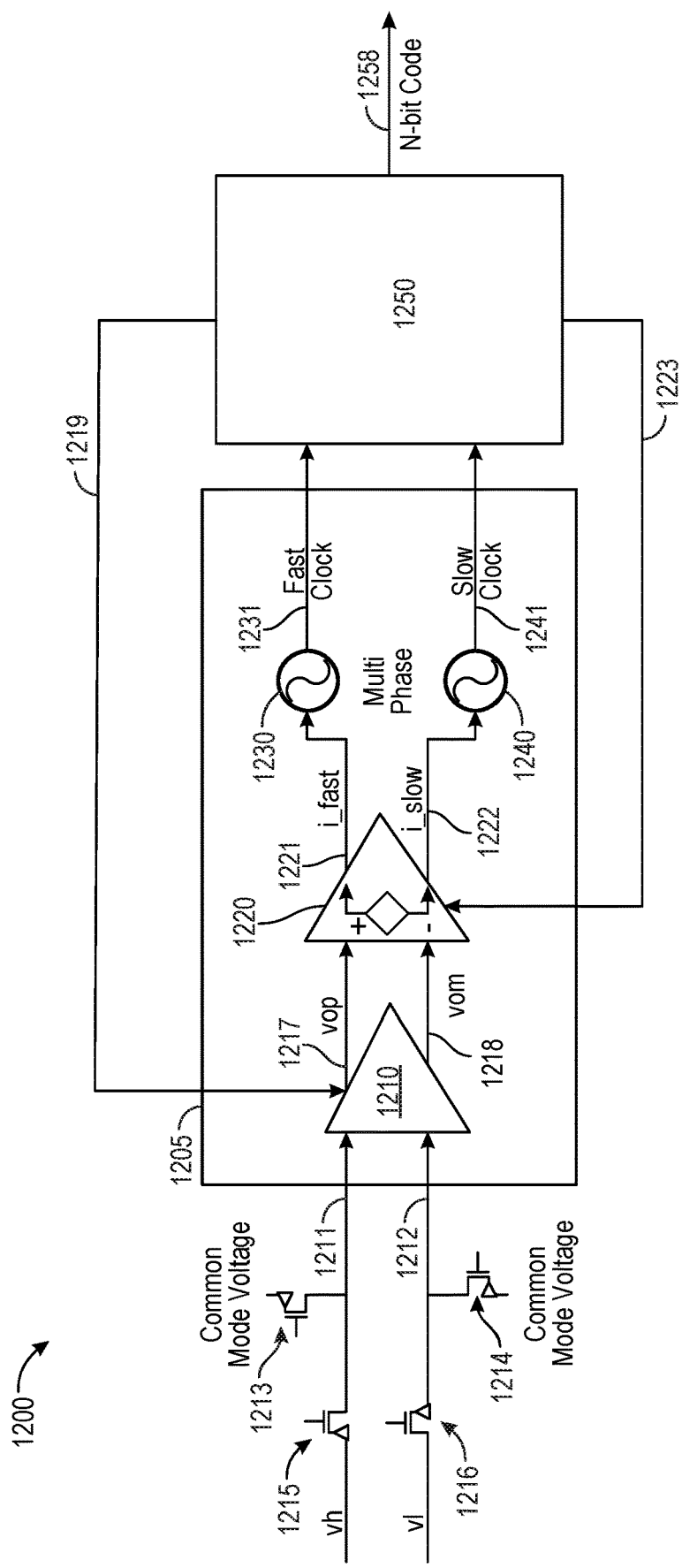
FIG. 12 illustrates an example architecture for voltage-based current sensing.

FIG. 12 illustrates an example architecture 1200 for voltage-based current sensing. In one example, the architecture 1200 uses a differential circuit architecture. The differential circuit architecture responds to differences in its inputs and not to a common mode in its inputs. In one example, the architecture 1200 includes a voltage based current sensor 1205. The voltage based current sensor 1205 may include a first input 1211 and a second input 1212 which are sent to an input amplifier 1210 with two amplifier outputs, a plus output Vop 1217 and a minus output Vom 1218. In one example, the first input 1211 is a voltage input (a.k.a., a first voltage input) and the second input 1212 is a voltage input (a.k.a., a second voltage input).

In one example, the first input 1211 is connected to a first common mode transistor 1213 and a first sensing transistor 1215. In one example, the second input 1212 is connected to a second common mode transistor 1214 and a second sensing transistor 1216. For example, the first sensing transistor 1215 has a first sensing input voltage vh and the second sensing transistor 1216 has a second sensing input voltage vl. In one example, the first common mode transistor 1213 and the first sensing transistor 1215 share a single common node. In one example, the second common mode transistor 1214 and the second sensing transistor 1216 share a single common node. In one example, the single common node (a.k.a. single first common node) shared between the first common mode transistor 1213 and the first sensing transistor 1215 is a different common node than the single common node (a.k.a. single second common node) shared between the second common mode transistor 1214 and the second sensing transistor 1216.

In one example, the plus output Vop 1217 and the minus output Vom 1218 serve as two inputs to a voltage-to-current converter 1220 with two current outputs, a first current output 1221 and a second current output 1222. In one example, the first current output 1221 (e.g., i_fast) is proportional to the plus output Vop 1217 and the second current output 1222 (e.g., i_slow) is proportional to the minus output Vom 1218.

In one example, the first current output 1221 serves as an input to a first oscillator 1230 and the second current output 1222 serves as an input to a second oscillator 1240. In one example, the first oscillator 1230 produces (i.e., generates) a first oscillator waveform 1231 (e.g., Fast_clock) and the second oscillator 1240 produces (i.e., generates) a second oscillator waveform 1241 (e.g. Slow_clock). In one example, the first oscillator waveform 1231 has a first frequency (a.k.a., a first oscillator waveform frequency) and the second oscillator waveform 1241 has a second frequency (a.k.a., a second oscillator waveform frequency). In one example, the first frequency (a.k.a., first oscillator waveform frequency) depends on the first current output 1221, for example, the first frequency (a.k.a., first oscillator waveform frequency) may be proportional to a first frequency measurement of the first current output 1221. In one example, the second frequency (a.k.a., second oscillator waveform frequency) depends on the second current output 1222, for example, the second frequency (a.k.a., second oscillator waveform frequency) may be proportional to a second frequency measurement of the second current output 1222. In one example, the first frequency may be proportional to a frequency (a.k.a., a first input frequency) of the first input 1211 and the second frequency may be proportional to a frequency (a.k.a., a second input frequency) of the second input 1212.

In one example, the first oscillator waveform 1231 has a first oscillator waveform frequency which is proportional to a first current measurement of the first current output 1221, and the second oscillator waveform 1242 has a second oscillator waveform frequency which is proportional to a second current measurement of the second current output 1222. In one example, the first oscillator waveform 1231 has a first oscillator waveform frequency which is proportional to a first voltage measurement of the first input 1211 (a.k.a., first voltage input), and the second oscillator waveform 1241 has a second oscillator waveform frequency which is proportional to a second voltage measurement of the second input 1212 (a.k.a., second voltage input).

In one example, the first oscillator waveform 1231 and the second oscillator waveform 1241 serve as two inputs to a calibration module 1250. The calibration module 1250 may provide (i.e., generates) a coarse offset 1219 (e.g., analog offset calibration) as illustrated in FIG. 6. In one example, the coarse offset 1219 may be sent to the input amplifier 1210. The calibration module 1250 may provide a fine offset (e.g., digital offset calibration) as illustrated in FIG. 7. In one example, the fine offset may be sent to an analog to digital converter (ADC) (not shown). In one example, the ADC is within the calibration module 1250. In another example, the ADC is external to the calibration module 1250. The calibration module 1250 may provide (i.e., generates) a frequency offset 1223 (e.g., ring oscillator calibration) as illustrated in FIG. 8. In one example, the frequency offset 1223 may be sent to the voltage-to-current converter 1220. The calibration module 1250 may provide a sensor transfer function as illustrated in FIG. 9. In one example, the sensor transfer function may be sent to the ADC.

The calibration module 1250 may have a digital output 1258 (e.g., ADC code). In one example, the digital output 1258 is an N bit code. For example, the digital output 1258 may measure a frequency difference between the first frequency and the second frequency. In one example, the digital output 1258 may measure a difference between first sensing input voltage vh and second sensing input voltage vl. In one example, the digital output 1258 may measure a load current (e.g., $I_{load}$ 230 shown in FIG. 2)

In one example, the architecture 1200 for voltage-based current sensing may sense very small voltages due to the differential circuit architecture. For example, the architecture 1200 for voltage-based current sensing may perform one or more of the following calibrations:

Frequency offset calibration-setting oscillator frequency in a common mode configuration;
Coarse calibration—reducing analog circuit offsets;
Fine calibration—reducing digital circuit offsets; and/or
Sensor transfer calibration—mapping ADC code to load current.

In one example, the voltage based current sensor 1200 may track resistance variations over process, voltage, temperature (PVT) to improve current sensor accuracy.

Figure 13:
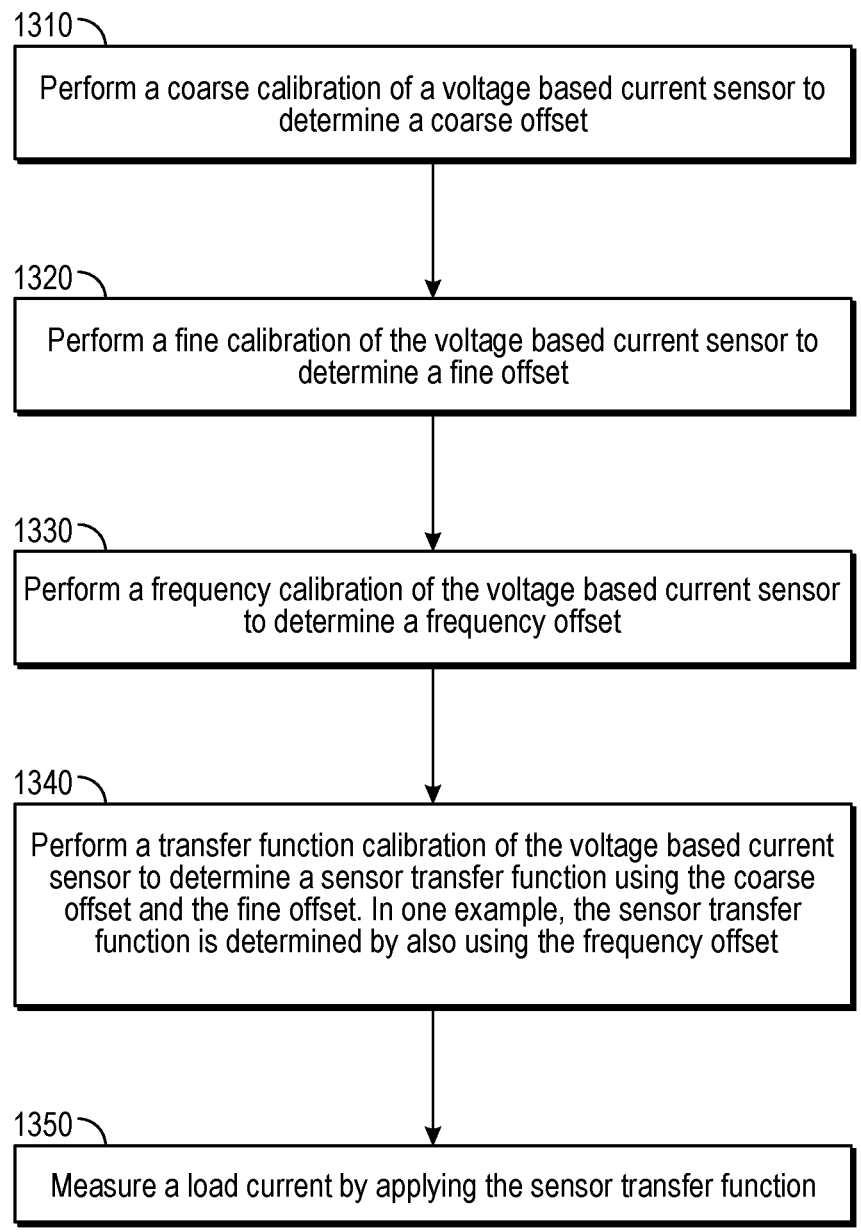
FIG. 13 illustrates an example flow diagram for voltage-based current sensing.

FIG. 13 illustrates an example flow diagram 1300 for voltage-based current sensing. In block 1310, perform a coarse calibration of a voltage based current sensor to determine a coarse offset of the voltage based current sensor. In one example, a first frequency comparison is used in performing the coarse calibration. In one example, the first frequency comparison is between frequencies of two oscillator waveforms in a common mode. In one example, the step(s) in block 1310 may be performed by one or more of the following components shown in FIGS. 6-9 and FIGS. 11-12, for example, in combination: a calibration module using a coarse offset and an input amplifier. In another example, the step(s) in block 1310 may be performed by one or more of the following components shown in FIGS. 6-9 and FIGS. 11-12, for example, in combination: a calibration module in conjunction with a coarse offset and a voltage based current sensor which may utilize one or more of its components, such as an input amplifier, a voltage-to-current converter, a first oscillator and a second oscillator.

In block 1320, perform a fine calibration of the voltage based current sensor to determine a fine offset of the voltage based current sensor. In one example, a second frequency comparison is used in performing the fine calibration. In one example, the second frequency comparison is between frequencies of two oscillator waveforms in a common mode. In one example, the step(s) in block 1320 may be performed by one or more of the following components shown in FIGS. 6-9 and FIGS. 11-12, for example, in combination: a calibration module and an analog to digital converter (ADC).

In block 1330, perform a frequency calibration of the voltage based current sensor to determine a frequency offset of the voltage based current sensor. In one example, a third frequency comparison is used in performing the frequency calibration. In one example, the third frequency comparison is between a frequency of an oscillator waveform and a calibrated frequency reference. In one example, the calibrated frequency reference has a lower frequency inaccuracy and a lower frequency instability than the frequency of the oscillator waveform. In one example, the step(s) in block 1330 may be performed by one or more of the following components shown in FIGS. 6-9 and FIGS. 11-12, for example, in combination: a calibration module in conjunction with a frequency offset and a voltage-to-current converter. In another example, the step(s) in block 1330 may be performed by one or more of the following components shown in FIGS. 6-9 and FIGS. 11-12, for example, in combination: a calibration module in conjunction with a frequency offset and a voltage based current sensor which may utilize one or more of its components, such as an input amplifier, a voltage-to-current converter, a first oscillator and a second oscillator.

In block 1340, perform a transfer function calibration of the voltage based current sensor to determine a sensor transfer function using the coarse offset and the fine offset. In one example, a fourth frequency comparison is used in performing the transfer function calibration. In one example, the sensor transfer function is a mapping from a load current to an ADC code (e.g., ADC code vs. load current). In one example, the sensor transfer function is determined by also using the frequency offset of the voltage based current sensor. In one example, the step(s) in block 1340 may be performed by one or more of the following components shown in FIGS. 6-9 and FIGS. 11-12, for example, in combination: a calibration module in conjunction with a reference voltage based current sensor (e.g., a Globally Distributed Head Switches (GDHS)) coupled to a load current, and an analog to digital converter (ADC). In another example, the step(s) in block 1340 may be performed by one or more of the following components shown in FIGS. 6-9 and FIGS. 11-12, for example, in combination: a calibration module in conjunction with a reference voltage based current sensor (e.g., a Globally Distributed Head Switches (GDHS)) coupled to a load current, an analog to digital converter (ADC), and a voltage based current sensor which may utilize one or more of its components, such as an input amplifier, a voltage-to-current converter, a first oscillator and a second oscillator.

In block 1350, measure a load current by applying the sensor transfer function. In one example, the load current is measured by using the sensor transfer function to map an ADC code to the load current. In one example, the measuring the load current includes correcting the coarse offset and correcting the fine offset. In one example, the step(s) in block 1350 may be performed by one or more of the following components shown in FIGS. 6-9 and FIGS. 11-12, for example, in combination: a calibration module, an analog to digital converter (ADC) and a voltage based current sensor which may utilize one or more of its components, such as an input amplifier, a voltage-to-current converter, a first oscillator and a second oscillator.

In another example, the step(s) in block 1350 may be performed by one or more of the following components shown in FIGS. 6-9 and FIGS. 11-12, for example, in combination: a calibration module, an analog to digital converter (ADC) and a voltage based current sensor which may utilize one or more of its components, such as an input amplifier, a voltage-to-current converter, a first oscillator and a second oscillator, and a first sensing transistor and a connected to a first input of the voltage based current sensor and a second sensing transistor connected to a second input of the voltage based current sensor.

In another example, the step(s) in block 1350 may be performed by one or more of the following components shown in FIGS. 6-9 and FIGS. 11-12, for example, in combination: a calibration module, an analog to digital converter (ADC) and a voltage based current sensor which may utilize one or more of its components, such as an input amplifier, a voltage-to-current converter, a first oscillator and a second oscillator, and a first sensing transistor and a first common mode transistor connected to a first input of the voltage based current sensor, and a second sensing transistor and a second common mode transistor connected to a second input of the voltage based current sensor.

In one aspect, one or more of the steps for providing voltage-based current sensing in FIG. 13 may be executed by one or more processors which may include hardware, software, firmware, etc. In one aspect, one or more of the steps in FIG. 13 may be executed by one or more processors which may include hardware, software, firmware, etc. The one or more processors, for example, may be used to execute software or firmware needed to perform the steps in the flow diagram of FIG. 13. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for performing voltage-based current sensing. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method for implementing voltage-based current sensing, the method comprising:
    performing a coarse calibration of a voltage based current sensor to determine a coarse offset;
    performing a fine calibration of the voltage based current sensor to determine a fine offset; and
    performing a transfer function calibration of the voltage based current sensor to determine a sensor transfer function using the coarse offset and the fine offset,
    measuring a load current by applying the sensor transfer function, and performing a frequency calibration of the voltage based current sensor to determine a frequency offset, wherein the performing the coarse calibration comprises comparing a first current with a second current of a voltage-to-current conversion and comparing a first frequency of a first oscillator waveform with a second frequency of a second oscillator waveform in a common mode, and wherein the first oscillator waveform and the second oscillator waveform are outputs of the voltage based current sensor.

2. The method of claim 1, wherein the performing the transfer function calibration also uses the frequency offset to determine the sensor transfer function.

3. The method of claim 1, wherein the measuring the load current uses the sensor transfer function to map an analog to digital converter (ADC) code to the load current, wherein the ADC code is an output of the voltage based current sensor.

4. The method of claim 1, wherein the performing the frequency calibration comprises comparing a frequency of an oscillator waveform with a calibrated frequency reference and wherein the calibrated frequency reference has a lower frequency inaccuracy and a lower frequency instability than the frequency of the oscillator waveform, and wherein the oscillator waveform is an output of the voltage based current sensor.

5. The method of claim 1, wherein the performing the fine calibration comprises comparing a third frequency of a third oscillator waveform with a fourth frequency of a fourth oscillator waveform in a common mode, wherein the third oscillator waveform and the fourth oscillator waveform are outputs of the voltage based current sensor.

6. The method of claim 5, wherein the first frequency is different from the third frequency, and the second frequency is different from the fourth frequency.

7. The method of claim 5, wherein the first oscillator waveform is different from the third oscillator waveform, and the second oscillator waveform is different from the fourth oscillator waveform.

8. A computer-readable medium storing computer executable code, operable on a device comprising at least one processor and at least one memory coupled to the at least one processor, wherein the at least one processor is configured to implement voltage-based current sensing, the computer executable code comprising:

instructions for causing a computer to perform a coarse calibration of a voltage based current sensor to determine a coarse offset;

instructions for causing the computer to perform a fine calibration of the voltage based current sensor to determine a fine offset;

instructions for causing the computer to perform a frequency calibration of the voltage based current sensor to determine a frequency offset;

instructions for causing the computer to perform a transfer function calibration of the voltage based current sensor to determine a sensor transfer function using the coarse offset, the fine offset and the frequency offset;

instructions for causing the computer to measure a load current by applying the sensor transfer function; and instructions for causing a computer to perform a frequency calibration of the voltage based current sensor to determine a frequency offset, and wherein the instructions for causing the computer to perform the coarse calibration comprises instructions for causing the computer to compare a first current with a second current of a voltage-to-current conversion and for causing the computer to compare a first frequency of a first oscillator waveform with a second frequency of a second oscillator waveform in a common mode, and wherein the first oscillator waveform and the second oscillator waveform are outputs of the voltage based current sensor.

* * * * *